United States Patent
Xia et al.

(10) Patent No.: US 11,791,349 B2
(45) Date of Patent: Oct. 17, 2023

(54) MANUFACTURING METHOD FOR DISPLAY PANEL AND DISPLAY PANEL

(71) Applicants: Beihai HKC Optoelectronics Technology Co., Ltd., Beihai (CN); HKC CORPORATION LIMITED, Shenzhen (CN)

(72) Inventors: Yuming Xia, Beihai (CN); En-Tsung Cho, Beihai (CN); Chongwei Tang, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 182 days.

(21) Appl. No.: 17/377,399

(22) Filed: Jul. 16, 2021

(65) Prior Publication Data
US 2022/0037371 A1   Feb. 3, 2022

(30) Foreign Application Priority Data

Jul. 29, 2020 (CN) .......................... 202010743740.X

(51) Int. Cl.
*H01L 27/12* (2006.01)

(52) U.S. Cl.
CPC ........ *H01L 27/1259* (2013.01); *H01L 27/124* (2013.01); *H01L 27/127* (2013.01); (Continued)

(58) Field of Classification Search
CPC ............. H01L 27/1259; H01L 27/1292; H01L 27/1262; H01L 21/76873
See application file for complete search history.

(56) References Cited

U.S. PATENT DOCUMENTS

| | | | | |
|---|---|---|---|---|
| 2003/0171003 A1* | 9/2003 | Kim | ..................... | H01L 27/1292 438/761 |
| 2004/0203181 A1* | 10/2004 | Shang | ............... | H01L 29/42384 438/30 |
| 2019/0196285 A1 | 6/2019 | Zhou et al. | | |

FOREIGN PATENT DOCUMENTS

CN          104701384 A        6/2015

OTHER PUBLICATIONS

J. Bi et al., "Pulse electro-deposition of copper on molybdenum for Cu(In,Ga)Se2 and Cu2ZnSnSe4 solar cell applications," Journal of Power Sources 326 (2016) 211-219. (Year: 2016).*

(Continued)

*Primary Examiner* — Peter M Albrecht

(57) ABSTRACT

The present application discloses a manufacturing method for a display panel and the display panel, and the manufacturing method includes a manufacture procedure of forming an array substrate, where the manufacture procedure of forming an array substrate includes: forming a buffer layer with a preset pattern on a glass substrate; placing the glass substrate with the buffer layer formed thereon into an electrochemical deposition device, and performing electrochemical deposition to form a copper alloy metal layer corresponding to the buffer layer; heating and annealing the copper alloy metal layer to form a first metal layer; sequentially forming an insulating layer, an active layer, a second metal layer, a passivation layer and a transparent electrode layer on the first metal layer, where the first metal layer includes a buffer layer and a copper alloy metal layer.

8 Claims, 5 Drawing Sheets

(52) U.S. Cl.
CPC ...... *H01L 27/1222* (2013.01); *H01L 27/1262* (2013.01); *H01L 27/1292* (2013.01)

(56) References Cited

OTHER PUBLICATIONS

W.-S. Chiang et al., "Pulse electrodeposition of copper-manganese alloy in deep eutectic solvent," Journal of Alloys and Compounds 742 (2018) 38-44. (Year: 2018).*
A.-M. E. Suriano, "Electrodeposition of Ultra-Radiopure Copper-Chromium Alloys" (2016). (Year: 2016).*

* cited by examiner

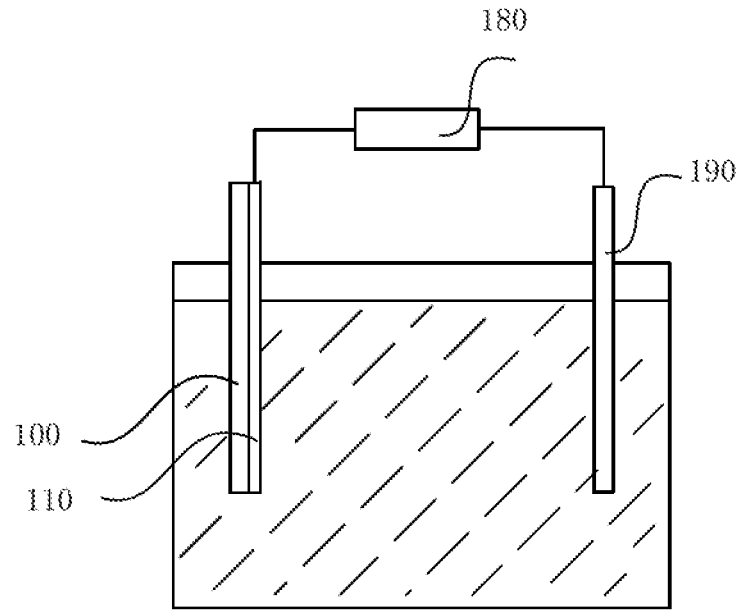

FIG. 3

Placing the glass substrate with the molybdenum buffer layer or the molybdenum alloy buffer layer formed thereon into an electrochemical deposition solution containing cupric ions, and depositing for 30-100 seconds to generate elemental copper — S21

Placing the glass substrate with the molybdenum buffer layer or the molybdenum alloy buffer layer formed thereon into an electrochemical deposition solution containing chromate ions, and depositing for 5-30 seconds to generate elemental chromium to form the copper alloy metal layer — S22

FIG. 4

MANUFACTURING METHOD FOR DISPLAY PANEL AND DISPLAY PANEL

The present application claims priority to Chinese Patent Application No. 202010743740.X, filed Jul. 29, 2020, which is hereby incorporated by reference herein as if set forth in its entirety.

TECHNICAL FIELD

The present application relates to the field of display technologies, particularly to a manufacturing method for a display panel and the display panel.

BACKGROUND

The statements herein merely provide background information related to the present application and do not necessarily constitute the conventional art.

A display panel includes a Thin Film Transistor (TFT) including a gate electrode, a source electrode, and a drain electrode which are made of metal, and generally, a combination of Al (aluminum), Al/Mo (aluminum/molybdenum), Al/Ti (aluminum/titanium), etc. However, as the requirements for the display panel become increasingly higher, Al has difficulty in satisfying a demand for fast electronic transport due to its low conductivity, and a Cu (copper) process has become a development trend and a process demand of a next-generation TFT due to many advantages.

In general, the manufacture procedure of Cu has some problems, such as etching difference, which results in low yield and high cost during patterning.

SUMMARY

The purpose of the present application is to provide a manufacturing method for a display panel and the display panel.

The present application discloses a manufacturing method for a display panel, which includes a manufacture procedure of forming an array substrate, where the manufacture procedure of forming the array substrate includes the following steps:

forming a buffer layer with a preset pattern on a glass substrate;

placing the glass substrate with the buffer layer formed thereon into an electrochemical deposition device, and performing electrochemical deposition to form a copper alloy metal layer corresponding to the buffer layer;

heating and annealing the copper alloy metal layer to form a first metal layer; and sequentially forming an insulating layer, an active layer, a second metal layer, a passivation layer and a transparent electrode layer on the first metal layer;

where the first metal layer includes a buffer layer and a copper alloy metal layer.

The present application further discloses a manufacturing method for a display panel, which includes a manufacture procedure of forming an array substrate, where the manufacture procedure of forming the array substrate includes the following steps:

forming a molybdenum buffer layer or a molybdenum alloy buffer layer with a preset pattern on a glass substrate;

placing a glass substrate with a molybdenum buffer layer or a molybdenum alloy buffer layer formed thereon as well as a counter electrode which jointly form a current loop into electrochemical deposition solution containing copper ions and chromium ions, and applying a pulse voltage by a scanning line through a short-circuit strip to enable the counter electrode and the molybdenum buffer layer or the molybdenum alloy buffer layer to form the current loop;

applying pulse voltage with the potential of 0.3419 V for 40-80 seconds to enable the counter electrode and the molybdenum buffer layer or the molybdenum alloy buffer layer to form the current loop, and promoting cupric ions in the electrochemical deposition solution to perform a reduction reaction to generate elemental copper; then applying a pulse voltage with the potential of $-0.740$ V for 5 to 10 seconds to form the current loop between the counter electrode and the molybdenum buffer layer or the molybdenum alloy buffer layer, and promoting chromate in the electrochemical deposition solution to perform a reduction reaction to generate elemental chromium to obtain a copper alloy metal layer;

heating the copper alloy metal layer at the temperature of 300-500° C. for 30-120 minutes to diffuse chromium to the surface and forming a passivation protection layer on the surface of the copper alloy metal layer, and the formed buffer layer and the copper alloy metal layer being a gate electrode metal layer and/or a scanning line metal layer; and sequentially forming an insulating layer, an active layer, a source-drain electrode metal layer and/or a data line metal layer, a passivation layer and a transparent electrode layer on the gate electrode metal layer and/or the scanning line metal layer.

The present application further discloses a display panel, which includes an array substrate manufactured by the manufacturing method for the display panel and a color filter substrate arranged opposite to the array substrate.

Compared with the solution that copper needs to be etched when the first metal layer is formed, forming the first metal layer in the present application includes forming the buffer layer with the preset pattern corresponding to the first metal layer on the glass substrate, placing the buffer layer with the preset pattern in the electrochemical deposition device, depositing the copper alloy metal layer, and forming the first metal layer with the preset pattern of the copper alloy metal layer by heating and annealing. When the copper alloy metal layer is formed as the first metal layer, an etching process is not needed, so that the etching process is saved, thus avoiding the problems of low yield and high cost caused by the etching process, improving the product yield and reducing the cost.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings:

FIG. 3 is a schematic diagram of an electrochemical deposition device according to an embodiment of the present application:

FIG. 4 is a schematic flowchart of the process of another embodiment of step S2 in the flowchart of FIG. 1 according to the present application;

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described in details by reference to the accompanying drawings and optional embodiments.

Figure 1:
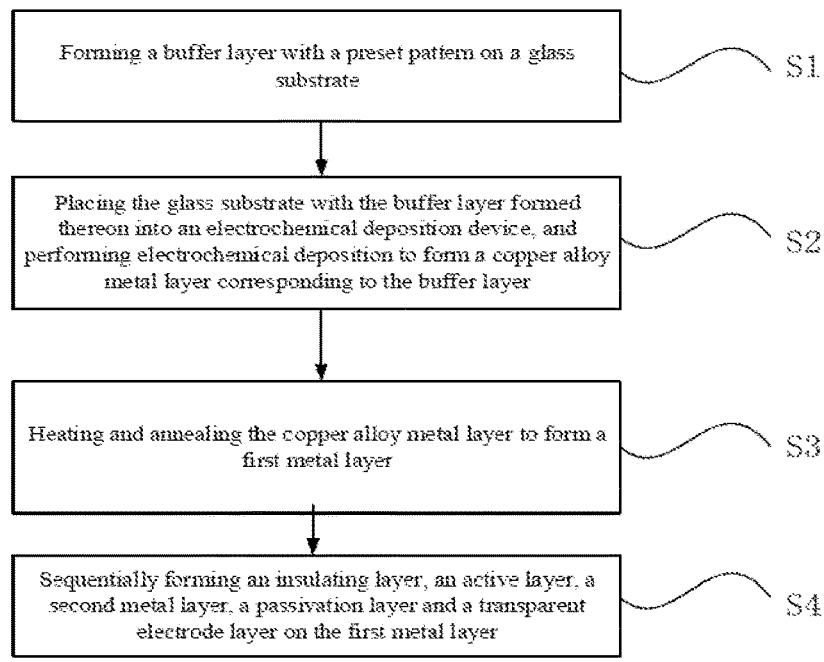
FIG. 1 is a schematic flowchart of a manufacturing method for a display panel according to an embodiment of the present application.

FIG. 1 is a schematic flowchart of a manufacturing method for a display panel according to an embodiment of the present application. As shown in FIG. 1, the present application discloses a manufacturing method for a display panel, which includes a manufacture procedure of forming an array substrate, where the manufacture procedure of forming the array substrate includes:

S1: forming a buffer layer with a preset pattern on a glass substrate;

S2: placing the glass substrate with the buffer layer with the preset pattern formed thereon into an electrochemical deposition device, and carrying out electrochemical deposition to form a copper alloy metal layer corresponding to the buffer layer with the preset pattern, where the position of the copper alloy metal layer corresponds to the position of the buffer layer with the preset pattern;

S3: heating and annealing the copper alloy metal layer to form a first metal layer including a buffer layer with a preset pattern and the copper alloy metal layer; and S4: sequentially forming an insulating layer, an active layer, a second metal layer, a passivation layer and a transparent electrode layer on the first metal layer;

where the preset pattern has a shape corresponding to a pattern shape of the first metal layer.

Compared with the solution that copper needs to be etched when the first metal layer is formed, forming the first metal layer in the present application includes forming the buffer layer with the preset pattern corresponding to the first metal layer on the glass substrate, placing the buffer layer with the preset pattern in the electrochemical deposition device, depositing the copper alloy metal layer, and forming the first metal layer with the preset pattern of the copper alloy metal layer by heating and annealing. When the copper alloy metal layer is formed as the first metal layer, an etching process is not needed, so that the etching process is saved, thus avoiding the problems of low yield and high cost caused by the etching process, improving the product yield and reducing the cost.

Specifically, when a Thin Film Transistor (TFT) formed on the array substrate is a bottom-gate structure, the first metal layer includes a gate electrode and a scanning line formed in the same layer by electrochemical deposition. The TFT may also be a top-gate structure, and electrochemical deposition method is also applicable to form the gate electrode.

The technical principle of electrochemical deposition is as follows: Electrochemical Deposition (ECD) is a technique in which positive and negative ions migrate in an electrolyte solution when current passes through the electrolyte solution under the action of an applied electric field and an oxidation-reduction reaction gaining or losing electrons occurs on an electrode to form a coating.

Specifically, in the step of forming a buffer layer with a preset pattern on a glass substrate, the buffer layer includes a molybdenum buffer layer or a molybdenum alloy buffer layer. The molybdenum buffer layer or the molybdenum alloy buffer layer is provided, which is beneficial to improving the adhesion force to the glass substrate, and the buffer layer can also include Ti (titanium)/MoN (molybdenum nitride) and the like.

Figure 2:
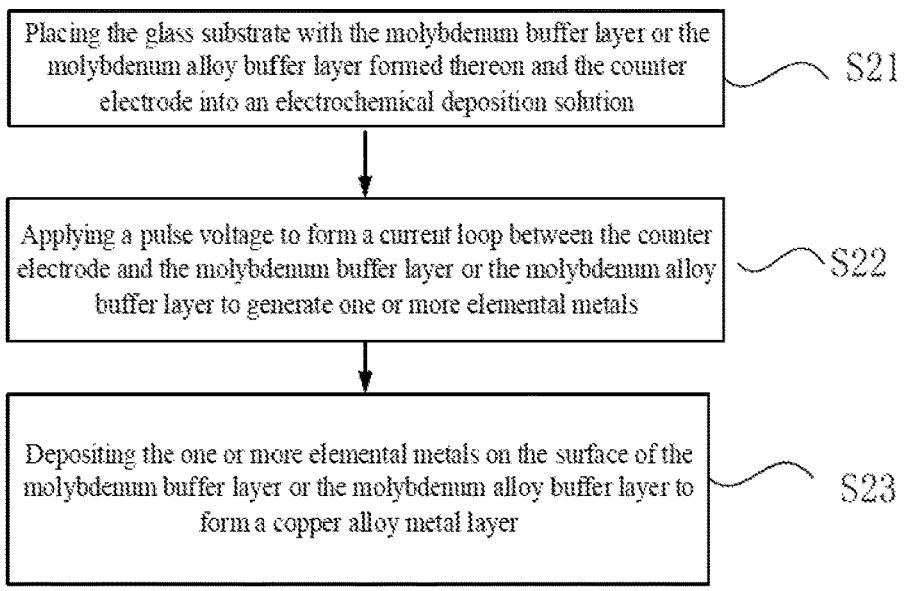
FIG. 2 is a schematic flowchart of step S2 in the flowchart of FIG. 1 of the present application.

FIG. 2 is a schematic flowchart of step S2 in the flowchart of FIG. 1 of the present application, FIG. 3 is a schematic diagram of an electrochemical deposition device according to an embodiment of the present application, and as shown in FIGS. 2 and 3, after the step S1 of forming a buffer layer with a preset pattern on a glass substrate, the step S2 of placing the glass substrate with the buffer layer with the preset pattern formed thereon into an electrochemical deposition device, and carrying out electrochemical deposition to form a copper alloy metal layer corresponding to the buffer layer with the preset pattern includes the sub-steps of:

S21: placing the glass substrate with the molybdenum buffer layer or the molybdenum alloy buffer layer with a preset pattern formed thereon and the counter electrode into an electrochemical deposition solution;

S22: applying a pulse voltage to form a current loop between the counter electrode and the molybdenum buffer layer or the molybdenum alloy buffer layer, and promoting metal cations in the electrochemical deposition solution to perform a reduction reaction to generate one or more elemental metals; and S23: depositing the one or more elemental metals on the surface of the molybdenum buffer layer or the molybdenum alloy buffer layer to form a copper alloy metal layer corresponding to the buffer layer with the preset pattern;

where the electrochemical deposition device includes an electrochemical deposition solution, a pulse power source 180, and a counter electrode 190 connected to one end of the pulse power source, where the other end of the pulse power source 190 is connected to the molybdenum buffer layer or the molybdenum alloy buffer layer.

The whole current loop is formed by applying a pulse voltage through placing a glass substrate with a buffer layer containing molybdenum or molybdenum alloy formed thereon and a counter electrode for supplying system current into an electrochemical deposition solution. By applying a voltage, the proportion of metal elements in the deposition solution can be quantitatively controlled, so that the components of different formed metals can be more accurately controlled. The counter electrode serves as an anode, the glass substrate containing the molybdenum buffer layer or the molybdenum alloy buffer layer serves as a cathode, metal cations in the electrochemical deposition solution perform a reduction reaction at the cathode, which generates elemental metal that deposits on the surface of the glass substrate, where the stable electrochemical property results in the formed elemental metal is relatively stable. The duration of the electrochemical deposition operation was 1 minute. The required thickness of the film layer is usually 3000-4000 angstroms, so the electrochemical deposition operation is preferably performed for 1 minute.

the placing the glass substrate with the buffer layer with a preset pattern formed thereon into an electrochemical deposition device and performing electrochemical deposition to form a copper alloy metal layer corresponding to the buffer layer, where the electrochemical deposition solution includes cupric ions and chromate ions. The formed copper-chromium alloy has better bonding strength by controlling the concentration of cupric ions (Cu2+) and chromate ions (CrO42−) in the electrochemical deposition solution.

The step of applying a pulse voltage to form a current loop between the counter electrode and the molybdenum buffer layer or the molybdenum alloy buffer layer, and promoting metal cations in the electrochemical deposition solution to perform a reduction reaction to generate one or more elemental metals includes the sub-steps of:

applying a pulse voltage with the potential of 0.3419 V for 40-80 seconds to form a current loop between the counter electrode and the molybdenum buffer layer or the molybdenum alloy buffer layer, and promoting cupric ions in the electrochemical deposition solution to carry out reduction reaction to generate elemental copper; and then applying a pulse voltage with the potential of −0.740 V for 5-10 seconds to form a current loop between the counter electrode and the molybdenum buffer layer or the molybdenum alloy buffer layer, and promoting chromate in the electrochemical deposition solution to perform a reduction reaction to generate elemental chromium to obtain a copper alloy metal layer.

For the solution that the control of the deposited alloy components is realized by adjusting the voltage, the deposition rate is controlled by applying different reduction potentials and controlling the duration of applying corresponding different potentials because the reduction potentials of Cu and Cr are different, so that the deposition amount of the alloy components can be accurately controlled, and the performance of the formed alloy is favorably improved. And the mode of voltage control is simple to operate and easy to control.

Where the reduction expressions corresponding to Cu2+ and CrO42− are as follows: Cu2++2e=Cu; CrO42−+4H2O+6e→Cr+8OH−. The reduction potential of the copper ion is 0.3419 V, and the reduction potential of the chromium ion is −0.740 V. For example, the potential of CrO42− being reduced to Cr3+ is −0.740 V, if a smaller potential is provided, only Cr3+ can be reduced rather than Cu2+. The reduction reaction can be controlled by a method of combination of controlling the concentration and the potential of each ion in the electrochemical deposition solution, for example, beginning with a higher potential (namely more than 0.3419 V), Cu2+ exists in the electrolyte, with no CrO42− or little CrO42− exists, so only Cu2+ can be reduced and deposited, while at a lower potential (−0.740 V to 0.3419 V), only CrO42− can be reduced, and at this time, a certain concentration of CrO42− is added in the electrolyte to deposit alloy ions.

The control of the deposition amount of the alloy components can be realized by adjusting the pulse voltage and controlling the concentration. FIG. 4 is a schematic flowchart of the process of another embodiment of step S2 in the flowchart of FIG. 1 according to the present application, and as shown in FIG. 4, specifically, the step S2 of placing the glass substrate with the buffer layer with the preset pattern formed thereon into an electrochemical deposition device, and carrying out electrochemical deposition to form a copper alloy metal layer corresponding to the buffer layer with the preset pattern includes the sub-steps of:

S21: placing the glass substrate with the molybdenum buffer layer or the molybdenum alloy buffer layer with a preset pattern formed thereon into an electrochemical deposition solution containing cupric ions, and depositing for 30-100 seconds to generate elemental copper; and S22: placing the glass substrate with the molybdenum buffer layer or the molybdenum alloy buffer layer formed thereon into an electrochemical deposition solution containing chromate ions, and depositing for 5-30 seconds to generate elemental chromium to form the copper alloy metal layer.

By controlling the concentrations of the electrochemical deposition solutions through independently placing the glass substrate into different electrochemical deposition solutions, namely different electrochemical deposition solutions contain different ions with higher concentrations, the alloy components with different proportions are obtained, and the improvement of the performance of the formed alloy is facilitated.

Taking an electrochemical deposition solution containing Cu2+ as an example, specific components and corresponding concentration ranges are as follows: $Cu^{2+}$, such as copper sulfate, copper nitrate, copper chloride, etc., in a concentration range of 120-250 g/L, an acid, such as sulfuric acid, hydrochloric acid, phosphoric acid, etc., in a concentration range of 30-100 g/L, a brightener, such as sodium lauryl sulfate, polyoxyethylene, sodium propylene sulfonate, etc., in a concentration range of 0.3-1 mL/L, chloride ion, such as sodium chloride, potassium chloride, magnesium chloride, etc., in a concentration range of 30-120 mg/L, a leveler, such as polystyrene, polyacrylic acid, polyvinyl alcohol, etc., in a concentration range of 0.1-0.8 mL/L, and other additives, such as wetting agents, leveling agents, etc., in a concentration range of 0.1-1.5 mL/L.

After the step of placing the glass substrate with the buffer layer with the preset pattern formed thereon into an electrochemical deposition device, and carrying out electrochemical deposition to form a copper alloy metal layer corresponding to the buffer layer with the preset pattern, the step of heating and annealing the copper alloy metal layer to form a first metal layer including a buffer layer with a preset pattern and the copper alloy metal layer is performed, and the step specifically includes the following sub-steps:

heating the copper alloy metal layer at the temperature of 300-500° C. for 30-120 minutes to diffuse chromium to the surface and forming a passivation protection layer on the surface of the copper alloy metal layer.

In the heating and annealing process, deposited Cu and Cr atomic lattices can be rearranged by annealing to form a desirable lattice structure, in addition, the self-diffusivity of the alloy is utilized, which is the diffusion coefficient changes as a function of temperature, where the thermal diffusion coefficient of the chromium is relatively large, diffusing the chromium onto the surface to form a passivation protection layer, and the formed passivation protection layer can play a role in protecting the Cu and prevent the Cu from diffusing to other layers, so that the performance of the device is improved.

Figure 5:
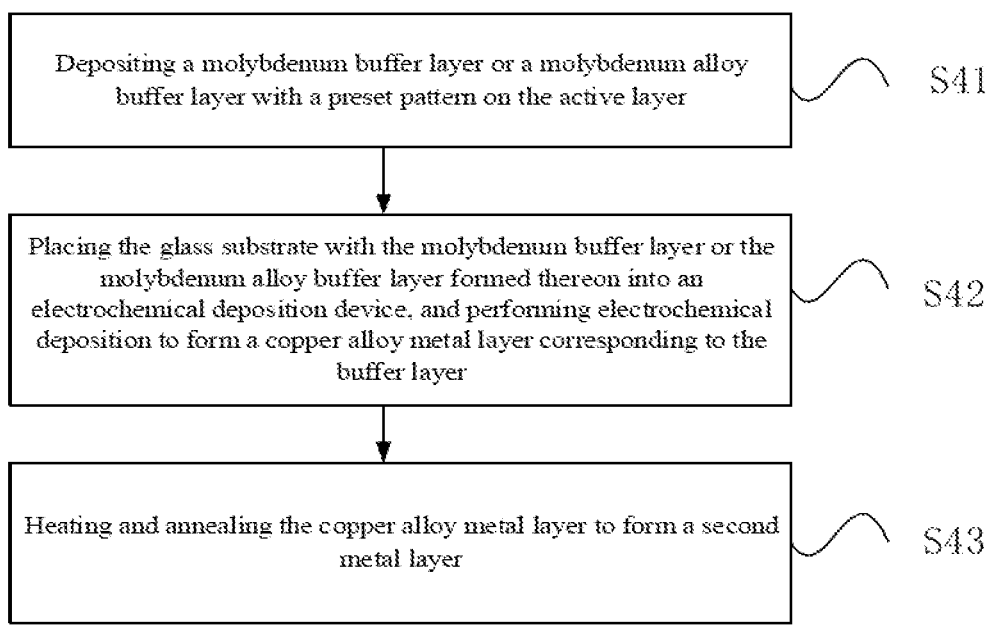
FIG. 5 is a schematic flowchart of a manufacturing method for a second metal layer of the display panel according to an embodiment of the present application.

FIG. 5 is a schematic flowchart of a manufacturing method for a second metal layer of the display panel according to an embodiment of the present application, and as shown in FIG. 5, in step S4 of sequentially forming an insulating layer, an active layer, a second metal layer, a passivation layer and a transparent electrode layer on the first metal layer to form an array substrate, the step of forming the second metal layer includes:

S41: depositing a molybdenum buffer layer or a molybdenum alloy buffer layer with a preset pattern on the active layer;

S42: placing the glass substrate with the molybdenum buffer layer or the molybdenum alloy buffer layer with a preset pattern formed thereon into an electrochemical deposition device, and performing electrochemical deposition to form a copper alloy metal layer corresponding to the buffer layer; and S43: heating and annealing the copper alloy metal layer to form a second metal layer including a buffer layer with a preset pattern and the copper alloy metal layer.

Forming the second metal layer includes firstly forming the buffer layer with the preset pattern corresponding to the first metal layer on the active layer, placing the buffer layer with the preset pattern in the electrochemical deposition device, depositing the copper alloy metal layer, and forming the first metal layer with the preset pattern of the copper alloy metal layer by heating and annealing. When the copper alloy metal layer is formed as the second metal layer, an etching process is not needed, so that the etching process is saved, thus avoiding the problems of low yield and high cost caused by the etching process, improving the product yield and reducing the cost. In addition, the buffer layer includes a molybdenum metal buffer layer and a molybdenum alloy buffer layer, so that the adhesion force can be improved.

Figure 6:
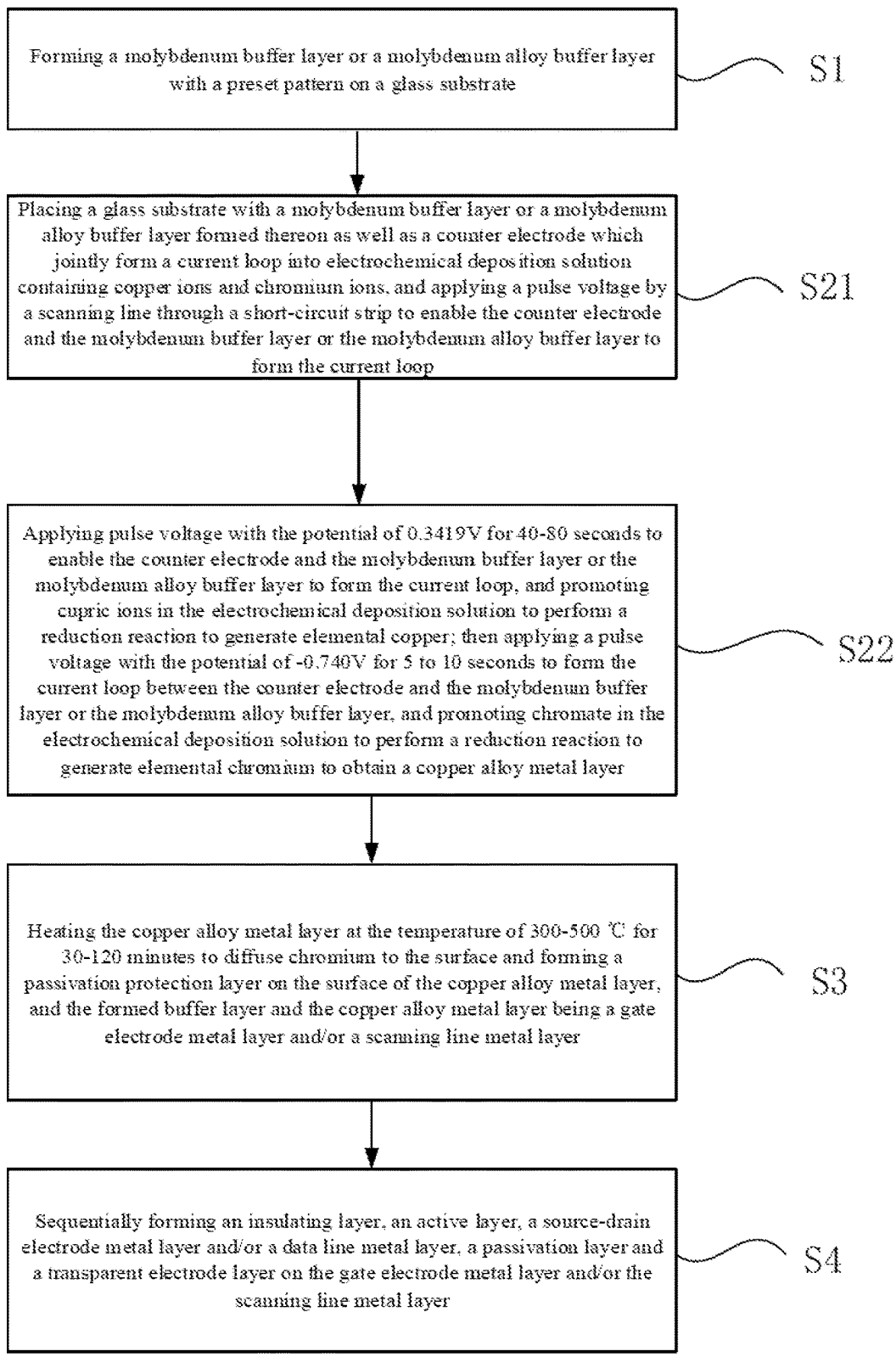
FIG. 6 is a schematic flowchart of a manufacturing method for a display panel according to another embodiment of the present application.

FIG. 6 is a schematic flowchart of a manufacturing method for a display panel according to another embodiment of the present application, and as shown in FIG. 6, as another embodiment of the present application, the present application further discloses a manufacturing method for a display panel, which includes a manufacture procedure of forming an array substrate, where the manufacture procedure of forming the array substrate includes:

S1: forming a molybdenum buffer layer or a molybdenum alloy buffer layer with a preset pattern on a glass substrate;

S21: placing a glass substrate with a molybdenum buffer layer or a molybdenum alloy buffer layer with a preset pattern formed thereon as well as a counter electrode which jointly form a current loop into electrochemical deposition solution containing copper ions and chromium ions, and applying a pulse voltage by a scanning line through a short-circuit strip to enable the counter electrode and the molybdenum buffer layer or the molybdenum alloy buffer layer to form the current loop;

S22: applying pulse voltage with the potential of 0.3419 V for 40-80 seconds to enable the counter electrode and the molybdenum buffer layer or the molybdenum alloy buffer layer to form the current loop, and promoting cupric ions in the electrochemical deposition solution to perform a reduction reaction to generate elemental copper; then applying a pulse voltage with the potential of −0.740 V for 5 to 10 seconds to form the current loop between the counter electrode and the molybdenum buffer layer or the molybdenum alloy buffer layer, and promoting chromate in the electrochemical deposition solution to perform a reduction reaction to generate elemental chromium to obtain a copper alloy metal layer;

S3: heating the copper alloy metal layer at the temperature of 300-500° C. for 30-120 minutes to diffuse chromium to the surface and forming a passivation protection layer on the surface of the copper alloy metal layer, and the formed buffer layer and the copper alloy metal layer with a preset pattern being a gate electrode metal layer and/or a scanning line metal layer; and S4: sequentially forming an insulating layer, an active layer, a source-drain electrode metal layer and/or a data line metal layer, a passivation layer and a transparent electrode layer on the gate electrode metal layer and/or the scanning line metal layer to form an array substrate.

In the present application, forming the first metal layer includes forming the buffer layer with the preset pattern corresponding to the first metal layer on the glass substrate, placing the buffer layer with the preset pattern in the electrochemical deposition device, depositing the copper alloy metal layer, and forming the first metal layer with the preset pattern of the copper alloy metal layer by heating and annealing. When the copper alloy metal layer is formed as the first metal layer, an etching process is not needed, so that the etching process is saved, thus avoiding the problems of low yield and high cost caused by the etching process, improving the product yield and reducing the cost. In the process of heating and annealing, the self-diffusivity of the alloy is utilized, which is the diffusion coefficient changes as a function of temperature, to form a passivation protection layer, and the formed passivation protection layer can play a role in protecting the Cu and prevent the Cu from diffusing to other layers, so that the performance of the device is improved. The preparation is carried out by adopting electrochemical deposition process in a liquid phase at normal temperature, so that the problem of conductivity reduction caused by poor surface flatness due to formation of coarse particles is avoided.

Figure 7:
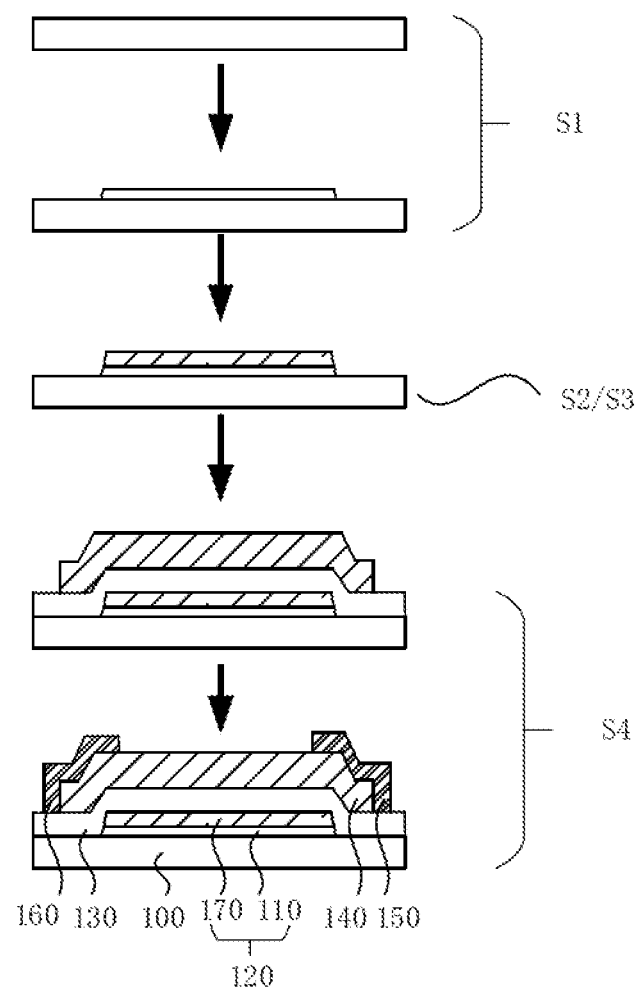
FIG. 7 is a structural schematic diagram of an array substrate of the display panel according to an embodiment of the present application.

FIG. 7 is a structural schematic diagram of a display panel according to an embodiment of the present application. As shown in FIG. 7, the present application further discloses a display panel, an array substrate manufactured by the manufacturing method for a display panel described above, and a color filter substrate disposed opposite to the army substrate. A display panel, which includes an array substrate and a color filter substrate disposed opposite to the array substrate. The array substrate includes: a glass substrate 100, a buffer layer 110, a first metal layer, an insulating layer 130, an active layer 140, a second metal layer, a passivation layer, and a transparent electrode layer; where the buffer layer is formed on the glass substrate; the first metal layer formed by placing the glass substrate with the buffer layer formed thereon into an electrochemical deposition device, and performing electrochemical deposition to form a copper alloy metal layer corresponding to the buffer layer, and heating and annealing the copper alloy metal layer; the insulating layer is formed on the first metal layer; the active layer is formed on the insulating layer; the second metal layer is formed on the active layer; the passivation layer formed on the second metal layer; the transparent electrode layer is formed on the passivation layer; where the first metal layer includes a buffer layer and a copper alloy metal layer. Specifically, the first metal layer forms a gate electrode, and the second metal layer forms a source electrode and a drain electrode. The array substrate includes a glass substrate 100, a buffer layer 110, a gate electrode 120, an insulating layer 130, an active layer 140, a source electrode 150, a drain electrode 160, a passivation layer and a transparent electrode layer, where the buffer layer is disposed on the glass substrate, the gate electrode is disposed on the buffer layer, the insulating layer covers the gate electrode, the active layer is disposed on the insulating layer, the source electrode and the drain electrode are disposed respectively on two sides of the active layer, the passivation layer and the transparent electrode layer are formed on the source electrode and the drain electrode, the copper alloy metal layer includes elemental chromium and elemental copper formed by an electrochemical deposition device through an electrochemical deposition solution, and the electrochemical deposition solution includes cupric ions ($Cu^{2+}$) and chromate ions ($CrO_4^{2-}$).

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical solution of the present application can be applied to a wide variety of display panels, such as Twisted Nematic (TN) display panels, In-Plane Switching (IPS) display panels, Vertical Alignment (VA) display panels, Multi-domain Vertical Alignment (MVA) display panels, and other types of display panels, such as Organic Light-Emitting Diode (OLED) display panels.

The above content is a further detailed description of the present application in conjunction with specific optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A manufacturing method for a display panel, comprising a manufacture procedure of forming an array substrate, wherein the manufacture procedure of forming the array substrate comprises the following steps:

forming a buffer layer with a preset pattern on a glass substrate;

placing the glass substrate with the buffer layer formed thereon into an electrochemical deposition device, and performing electrochemical deposition to form a copper alloy metal layer corresponding to the buffer layer;

heating and annealing the copper alloy metal layer to form a first metal layer; and sequentially forming an insulating layer, an active layer, and a second metal layer on the first metal layer;

wherein the first metal layer comprises the buffer layer and the copper alloy metal layer;

wherein in the step of forming the buffer layer with the preset pattern on the glass substrate, the buffer layer comprises a molybdenum buffer layer;

wherein the step of placing the glass substrate with the buffer layer formed thereon into an electrochemical deposition device and performing electrochemical deposition to form a copper alloy metal layer corresponding to the buffer layer comprises the sub-steps of:

placing the glass substrate with the molybdenum buffer layer formed thereon and a counter electrode into an electrochemical deposition solution;

applying a pulse voltage to form a current loop between the counter electrode and the molybdenum buffer layer to generate one or more elemental metals; and depositing the one or more elemental metals on a surface of the molybdenum buffer layer to form the copper alloy metal layer;

wherein the step of applying a pulse voltage to form a current loop between the counter electrode and the molybdenum buffer layer to generate one or more elemental metals comprises sub-steps of:

firstly applying a pulse voltage with a potential of 0.3419 V for 40-80 seconds to form a current loop between the counter electrode and the molybdenum buffer layer, and promoting cupric ions in the electrochemical deposition solution to carry out reduction reaction to generate elemental copper; and applying a pulse voltage with a potential of −0.740 V for 5-10 seconds to form a current loop between the counter electrode and the molybdenum buffer layer, to generate elemental chromium to obtain the copper alloy metal layer.

2. The manufacturing method according to claim 1, wherein in the step of placing the glass substrate with the buffer layer formed thereon into an electrochemical deposition device and performing electrochemical deposition to form a copper alloy metal layer corresponding to the buffer layer, an electrochemical deposition solution comprises cupric ions and chromate ions.

3. The manufacturing method according to claim 1, wherein the step of heating and annealing the copper alloy metal layer to form a first metal layer comprises:

heating the copper alloy metal layer at a temperature of 300-500° C. for 30-120 minutes to diffuse chromium to a surface of the copper alloy metal layer thus forming a passivation protection layer on the surface of the copper alloy metal layer.

4. The manufacturing method according to claim 1, wherein in the step of sequentially forming an insulating layer, an active layer, and a second metal layer on the first metal layer, the step of forming a second metal layer comprises:

depositing another molybdenum buffer layer or molybdenum alloy buffer layer with a preset pattern on the active layer;

placing the glass substrate with the molybdenum buffer layer or the molybdenum alloy buffer layer formed thereon into an electrochemical deposition device, and performing electrochemical deposition to form a second copper alloy metal layer corresponding to the molybdenum buffer layer or the molybdenum alloy buffer layer; and heating and annealing the second copper alloy metal layer to form the second metal layer;

wherein the second metal layer comprises the molybdenum buffer layer or the molybdenum alloy buffer layer and the second copper alloy metal layer.

5. The manufacturing method according to claim 1, wherein the preset pattern has a shape corresponding to a pattern shape of the first metal layer.

6. The manufacturing method according to claim 1, wherein the first metal layer comprises a gate electrode and a scanning line formed on the same layer by electrochemical deposition.

7. The manufacturing method according to claim 1, wherein the electrochemical deposition device comprises an electrochemical deposition solution, a pulse power source, and a counter electrode connected to one end of the pulse power source, wherein the other end of the pulse power source is connected to the molybdenum buffer layer.

8. A manufacturing method for a display panel, comprising a manufacture procedure of forming an array substrate, wherein the manufacture procedure of forming the array substrate comprises the following steps:

forming a molybdenum buffer layer or a molybdenum alloy buffer layer with a preset pattern on a glass substrate;

placing the glass substrate with the molybdenum buffer layer or the molybdenum alloy buffer layer formed thereon as well as a counter electrode which jointly form a current loop into an electrochemical deposition solution containing copper ions and chromium ions, and applying a pulse voltage by a scanning line through a short-circuit strip to enable the counter electrode and the molybdenum buffer layer or the molybdenum alloy buffer layer to form the current loop;

applying pulse voltage with the potential of 0.3419 V for 40-80 seconds to enable the counter electrode and the molybdenum buffer layer or the molybdenum alloy buffer layer to form the current loop, and promoting cupric ions in the electrochemical deposition solution to perform a reduction reaction to generate elemental copper; then applying a pulse voltage with the potential of −0.740 V for 5 to 10 seconds to form the current loop between the counter electrode and the molybdenum buffer layer or the molybdenum alloy buffer layer, and promoting chromate in the electrochemical deposition solution to perform a reduction reaction to generate elemental chromium to obtain a copper alloy metal layer;

heating the copper alloy metal layer at a temperature of 300-500° C. for 30-120 minutes to diffuse chromium to a surface of the copper alloy metal layer thus forming a passivation protection layer on the surface of the copper alloy metal layer, the formed molybdenum buffer layer or the molybdenum alloy buffer layer and copper alloy metal layer being a gate electrode metal layer and/or a scanning line metal layer; and sequentially forming an insulating layer, an active layer, a source-drain electrode metal layer and/or a data line metal layer on the gate electrode metal layer and/or the scanning line metal layer.

* * * * *